(12) United States Patent
Philip et al.

(10) Patent No.: US 12,156,486 B2
(45) Date of Patent: Nov. 26, 2024

(54) HORIZONTAL RRAM DEVICE AND ARCHITECTURE FOR VARIABILITY REDUCTION

(71) Applicant: INTERNATIONAL BUSINESS MACHINES CORPORATION, Armonk, NY (US)

(72) Inventors: Timothy Mathew Philip, Albany, NY (US); Christopher J. Penny, Saratoga Springs, NY (US); Nicholas Anthony Lanzillo, Wynantskill, NY (US); Youngseok Kim, Upper Saddle River, NJ (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 533 days.

(21) Appl. No.: 17/247,155

(22) Filed: Dec. 2, 2020

(65) Prior Publication Data

US 2022/0173313 A1 Jun. 2, 2022

(51) Int. Cl.
*H10N 70/00* (2023.01)
*H10N 70/20* (2023.01)

(52) U.S. Cl.
CPC ......... *H10N 70/253* (2023.02); *H10N 70/011* (2023.02); *H10N 70/823* (2023.02); *H10N 70/841* (2023.02); *H10N 70/8833* (2023.02)

(58) Field of Classification Search
CPC .......................... H10N 70/253; H10N 70/823
See application file for complete search history.

(56) References Cited

U.S. PATENT DOCUMENTS

| | | |
|---|---|---|
| 6,815,744 B1 | 11/2004 | Beck |
| 7,732,800 B2 | 6/2010 | Lai |
| 8,367,460 B2 | 2/2013 | Quick |
| 9,711,217 B1 | 7/2017 | Wu |
| 10,157,669 B2 | 12/2018 | Johnson |
| 10,199,100 B1 | 2/2019 | Lee |
| 10,304,532 B2 | 5/2019 | Johnson |
| 2007/0121363 A1 | 5/2007 | Lung |
| 2012/0261638 A1 | 10/2012 | Sills |
| 2016/0087197 A1 | 3/2016 | Tran |
| 2019/0156194 A1 | 5/2019 | Burr |
| 2019/0393269 A1 | 12/2019 | Li |
| 2022/0069213 A1* | 3/2022 | Wang ................. H10N 70/8265 |

OTHER PUBLICATIONS

Arumí, et al., "Unpredictable Bits Generation Based on RRAM Parallel Configuration," IEEE Electron Device Letters, Feb. 2019 [accessed on Mar. 25, 2020], pp. 341-344, vol. 40, No. 2.

(Continued)

*Primary Examiner* — Mark V Prenty
(74) *Attorney, Agent, or Firm* — Samuel A. Waldbaum

(57) ABSTRACT

An apparatus comprising a dielectric layer located between a first electrode and a second electrode and a third electrode located on the dielectric layer between the first electrode and the electrode, wherein the first electrode is separated from a first side of the third electrode by a first portion of the dielectric layer, and the second electrode is separated from a second side of the third electrode by a second portion of the dielectric layer.

17 Claims, 8 Drawing Sheets

(56) References Cited

OTHER PUBLICATIONS

Yu, et al., "Novel Vertical 3D Structure of TaOx-based RRAM with Self-localized Switching Region by Sidewall Electrode Oxidation," Scientific Reports, Nov. 24, 2015, 10 pages, vol. 6, DOI: 10:1038/srep21020.
Notification of Transmittal of the International Search Report and the Written Opinion of the International Searching Authority, or the Declaration, Date of mailing Mar. 17, 2022, International application No. PCT/EP2021/083148, 18 pages.

* cited by examiner

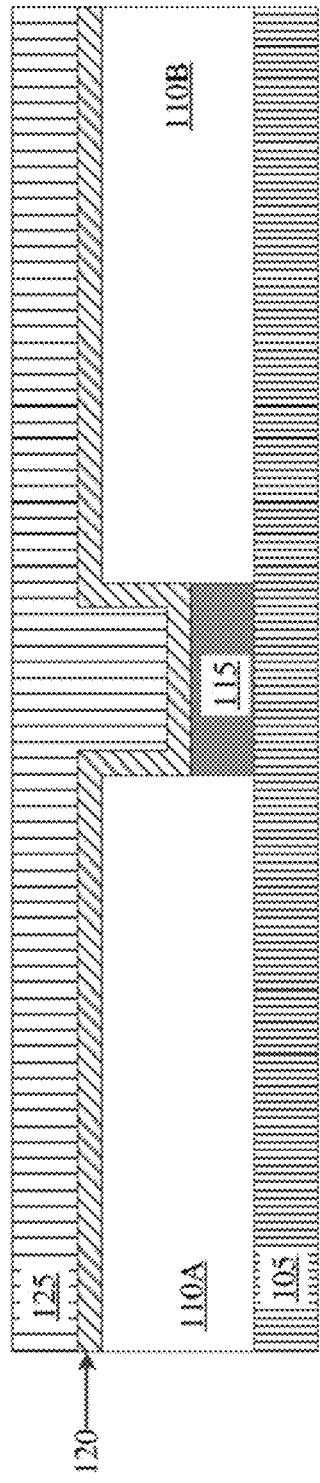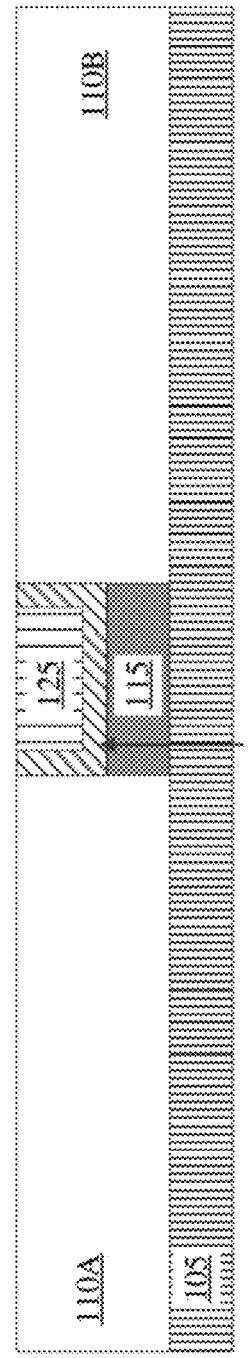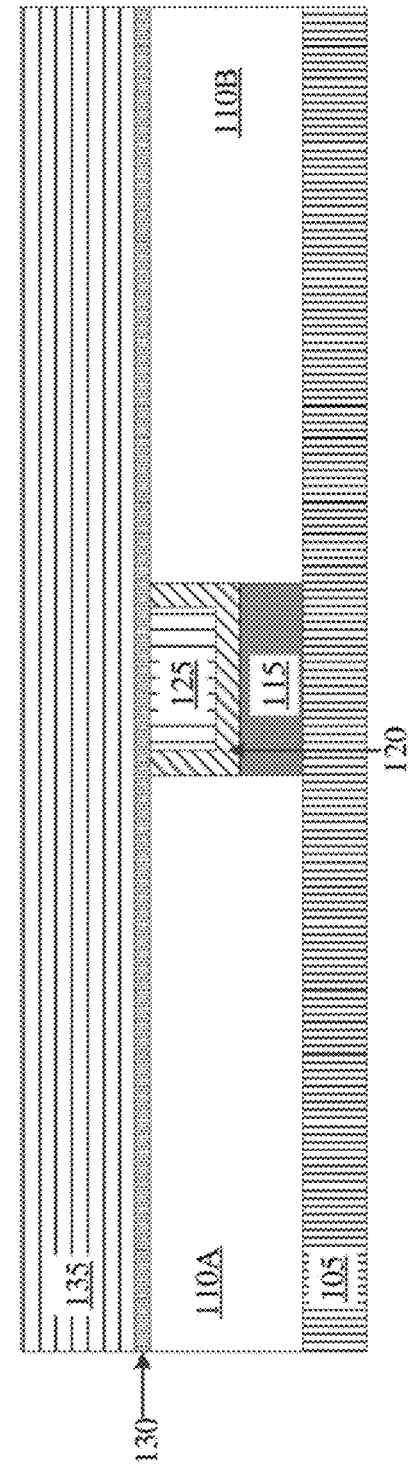

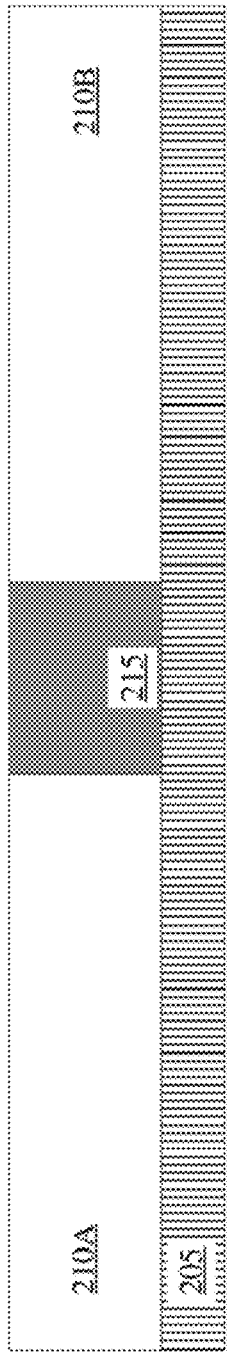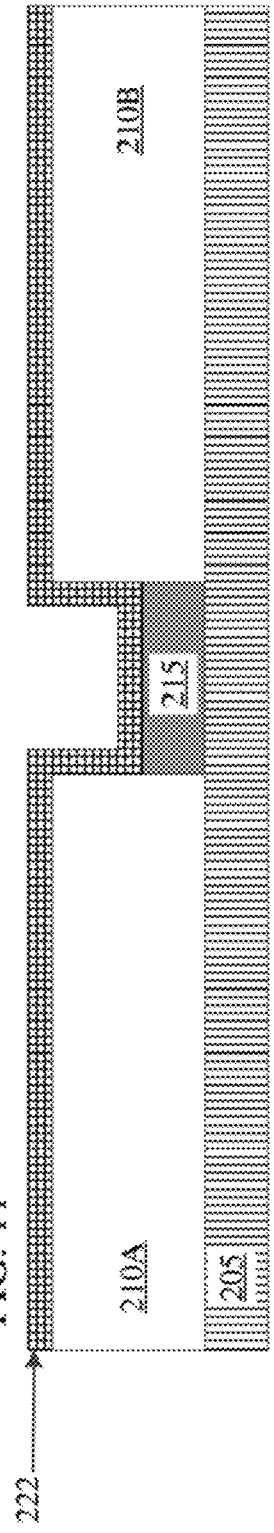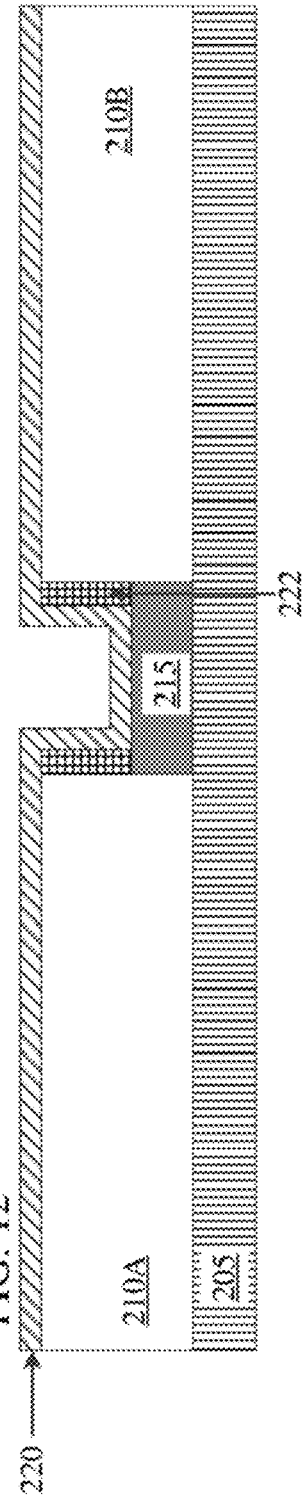

HORIZONTAL RRAM DEVICE AND ARCHITECTURE FOR VARIABILITY REDUCTION

BACKGROUND

The present invention relates generally to the field of RRAM array, and more particularly to formation of a RRAM array to reduce resistance variability.

Resistance RAM (RRAM) is a non-volatile memory structure that relies of forming and controlling a filamentary conduction path in a dielectric. Filament conduction is controlled by the movement of oxygen vacancies. The movement of oxygen vacancies is a fundamentally stochastic process that results in high variability in the resistance of the devices.

BRIEF SUMMARY

Additional aspects and/or advantages will be set forth in part in the description which follows and, in part, will be apparent from the description, or may be learned by practice of the invention.

An apparatus comprising a dielectric layer located between a first electrode and a second electrode and a third electrode located on the dielectric layer between the first electrode and the electrode, wherein the first electrode is separated from a first side of the third electrode by a first portion of the dielectric layer, and the second electrode is separated from a second side of the third electrode by a second portion of the dielectric layer.

In accordance with one aspect of the invention, the third electrode is comprised of a first layer and a second layer, wherein the first layer is in direct contact with the first electrode and the second electrode.

In accordance with one aspect of the invention, the second layer is in direct contact with the first layer and in direct contact with an upper metal component.

In accordance with one aspect of the invention, the material of the first layer is selected from the group consisting of includes $HfO_x$, $HfO_2$, $ZrO_2$, $TiO_2$, $Al_2O_3$, NiO, $MnO_2$, or $TaO_2$.

In accordance with one aspect of the invention, the material of the second layer is selected from the group consisting of includes TiN, Al, Ti, Cu, Ag, W, Pt, Au, Ni, TaN, conductive oxides such as indium tin oxide, Al- or Ga-doped ZnO, p-type doped Si, n-type doped Si, or any combination thereof.

In accordance with one aspect of the invention, the top surface of the first layer and second layer is planar with a top surface of the first electrode and a top surface of the second electrode.

In accordance with one aspect of the invention, the third electrode is located directly on top of a dielectric layer.

In accordance with one aspect of the invention, the first layer is in direct contact with the dielectric layer.

In accordance with one aspect of the invention, the material of the dielectric layer is selected from the group consisting of includes $SiO_2$, SiCOH, TEOS, SiN, low k dielectrics, or ultra-low k dielectrics.

In accordance with one aspect of the invention, the third electrode is comprised of a separating layer, a first layer and a second layer, wherein the separating layer is in direct contact with the first electrode and the second electrode.

In accordance with one aspect of the invention, the first layer is in direct contact with the separating layer, and wherein the second layer is in direct contact with the first layer and in direct contact with an upper metal component.

In accordance with one aspect of the invention, the third electrode is located directly on top of a dielectric layer.

In accordance with one aspect of the invention, the separating layer and the first layer are in direct contact with the dielectric layer.

In accordance with one aspect of the invention, wherein a first material for the first electrode is selected from the group consisting of includes Cu, Ru, Co, Rh, Mo, W, or Ta; wherein a second material for the second electrode is selected from the group consisting of includes Cu, Ru, Co, Rh, Mo, W, or Ta, wherein a third material for the separating layer is selected from the group consisting of includes Cu, Ru, Co, Rh, Mo, W, or Ta, wherein the third material and the first material are different and wherein the third material and the second material are different.

An apparatus comprising a plurality of lower electrodes spaced apart from each other. A plurality of dielectric layer layers, wherein one of the plurality of dielectric layers is located between two adjacent lower electrodes of the plurality of lower electrodes and a plurality of connecting electrodes, wherein each of the plurality of connecting electrodes is located on the dielectric layer located between two adjacent lower electrodes of the plurality of lower electrodes, wherein the one of the two adjacent lower electrodes is separated from a first side of the connecting electrode by a first portion of the dielectric layer, and the second of the two adjacent electrodes is separated from a second side of the connecting electrode by a second portion of the dielectric layer.

In accordance with one aspect of the invention, wherein each of the plurality of the connecting electrodes is comprised of a first layer and a second layer, wherein the first layer is in direct contact with the at least two adjacent lower electrodes of the plurality of lower electrodes.

In accordance with one aspect of the invention, wherein the second layer is in direct contact with the first layer and in direct contact with an upper metal component.

In accordance with one aspect of the invention, wherein the material of the first layer is selected from the group consisting of includes $HfO_x$, $HfO_2$, $ZrO_2$, $TiO_2$, $Al_2O_3$, NiO, $MnO_2$, or $TaO_2$.

In accordance with one aspect of the invention, wherein the material of the second layer is selected from the group consisting of includes TiN, Al, Ti, Cu, Ag, W, Pt, Au, Ni, TaN, conductive oxides such as indium tin oxide, Al- or Ga-doped ZnO, p-type doped Si, n-type doped Si, or any combination thereof.

In accordance with one aspect of the invention, wherein the top surface of the first layer and second layer is planar with a top surface of the plurality of the lower electrodes.

A method of forming a Resistance RAM (RRAM) structure comprising forming a first electrode and a second electrode. Forming a first dielectric layer between the first electrode and second electrode. Etching the first dielectric layer to form a trench between the first electrode and second electrode. Forming a third electrode inside the trench, wherein the first electrode is separated from a first side of the third electrode by a first portion of the dielectric layer, and the second electrode is separated from a second side of the third electrode by a second portion of the dielectric layer.

In accordance with one aspect of the invention, the third electrode is comprised of a first layer and a second layer, wherein the first layer is in direct contact with the first electrode and the second electrode.

In accordance with one aspect of the invention, wherein the second layer is in direct contact with the first layer and in direct contact with an upper metal component.

In accordance with one aspect of the invention, wherein the material of the first layer is selected from the group consisting of includes $HfO_x$, $HfO_2$, $ZrO_2$, $TiO_2$, $Al_2O_3$, $NiO$, $MnO_2$, or $TaO_2$.

In accordance with one aspect of the invention, wherein the material of the second layer is selected from the group consisting of includes TiN, Al, Ti, Cu, Ag, W, Pt, Au, Ni, TaN, conductive oxides such as indium tin oxide, Al- or Ga-doped ZnO, p-type doped Si, n-type doped Si, or any combination thereof.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 5 illustrates the formation of the third electrode along cross section A of the crossbar device, in accordance with an embodiment of the present invention.

FIG. 6 illustrates the planarization along cross section A of the crossbar device, in accordance with an embodiment of the present invention.

FIG. 7 illustrates the formation of an etch stop and a dielectric layer on the exposed surface along cross section A of the crossbar device, in accordance with an embodiment of the present invention.

FIG. 10 illustrates the formation of the first and second electrodes along cross section A of the crossbar device, in accordance with an embodiment of the present invention.

FIG. 11 illustrates the removal of dielectric material and the formation of separating layer along cross section A of the crossbar device, in accordance with an embodiment of the present invention.

FIG. 12 illustrates the removal of a portion of the separating layer and the formation of a first layer along the exposed surface along cross section A of the crossbar device, in accordance with an embodiment of the present invention.

DETAILED DESCRIPTION

Figure 1:
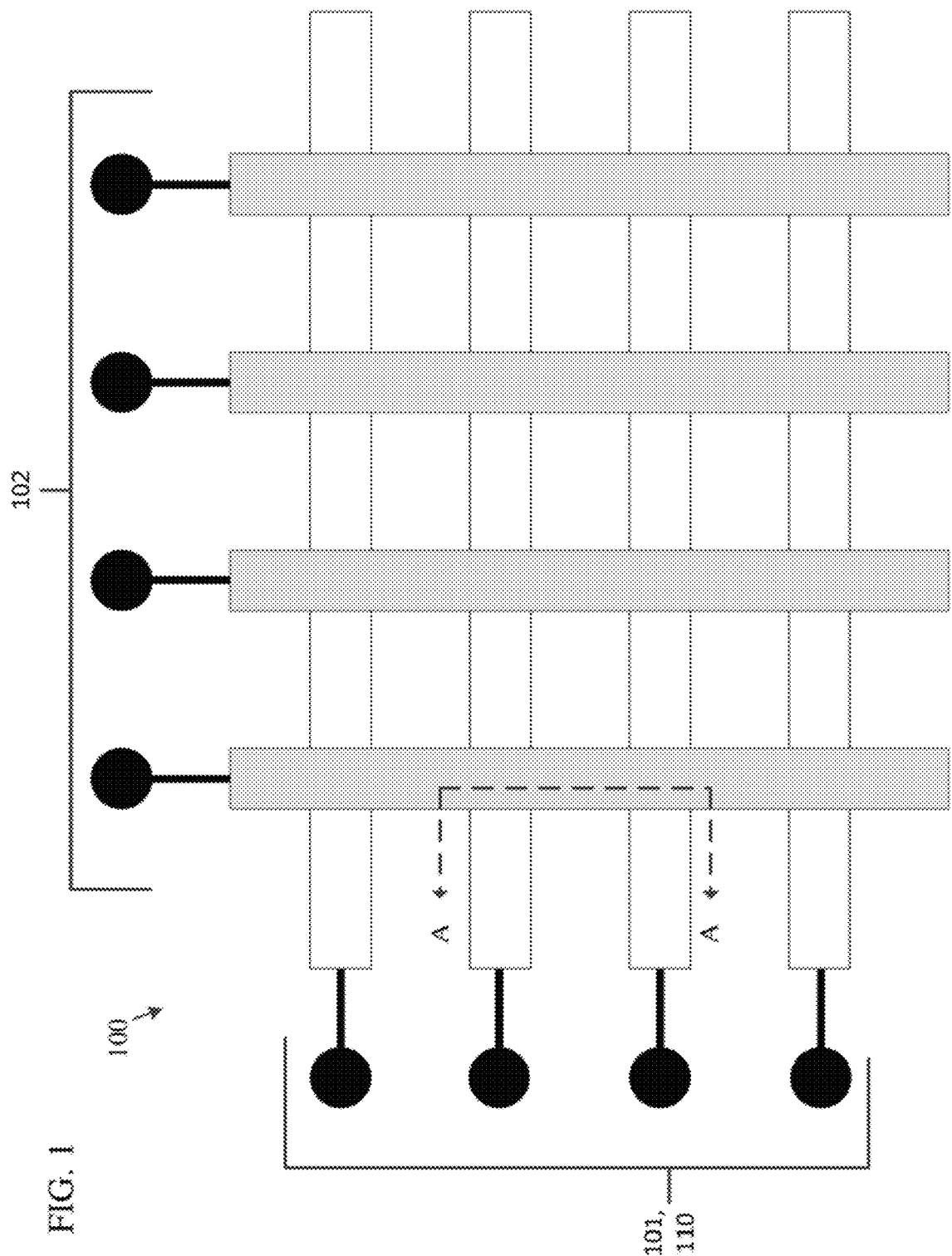
FIG. 1 illustrates a RRAM crossbar device, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal,"

"top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e. two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g. aluminum, copper, etc.) and insulators (e.g. various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. Embodiments of the present invention are generally directed to a RRAM crossbar array having the upper electrode located between two of the lower electrodes, thus each of the two lower electrodes are connected to different sides of the upper electrode. This allows for the lower metal electrodes to operate in parallel. A reduction of the resistance variability in the RRAM crossbar array results from operating the two lower electrodes in parallel. The variance of the RRAM Program Pair (RPP), e.g. two lower electrodes sharing a signal upper electrode, is ⅛ the resistance variance of a single RRAM device, e.g. the upper electrode being located on top of the lower electrode.

FIG. 1 illustrates a RRAM crossbar device 100, in accordance with an embodiment of the present invention. FIG. 1 illustrates a crossbar device having a plurality of lower metal bars 101 and a plurality of upper metal bars 102. FIG. 2 through FIG. 9 illustrate the formation of the shared electrode between two of the lower metal bars 110A and 110B.

Figure 2:
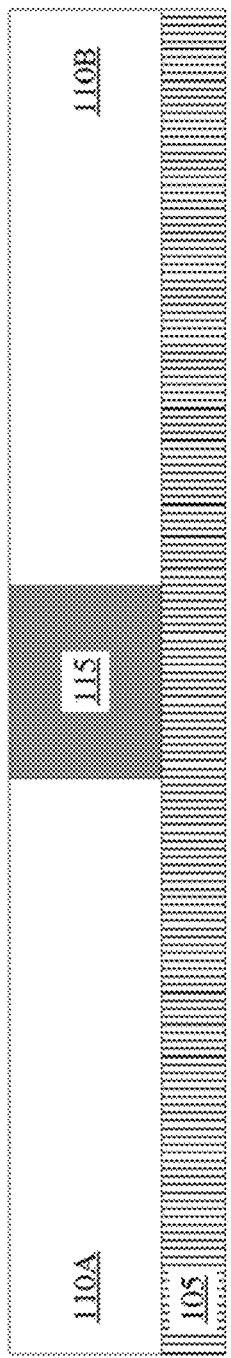
FIG. 2 illustrates the formation of the first and second electrodes along cross section A of the crossbar device, in accordance with an embodiment of the present invention.

FIG. 2 illustrates the formation of the first lower bars 110A and 110B along cross section A of the crossbar device 100, in accordance with an embodiment of the present invention.

A first metal layer 110 is formed on top of a substrate 105. The substrate 105 can be any type of material, for example, it can be, a substrate, silicon wafer, a sapphire wafer, a metal layer, a conductor layer, an insulator, or any other type of material used in creating multi-layered devices. The lower metal layer 110 can be formed by, for example, physical vapor deposition (PVD), atomic layer deposition (ALD) and chemical vapor deposition (CVD), or other deposition techniques. The lower metal layer 110 is etched to form each of the plurality of lower bars 101. The lower metal layer 110 can be etch by, for example, including the deposition of hard mask materials, lithography, pattern transfer and ultimately reactive ion etching (RIE) or other etching techniques. FIG. 2 illustrates a first lower bar 110A and a second lower bar 110B which resulted from the etching of the lower metal layer 110. The lower bar 110A or 110B can be formed of a material selected from a group that includes Cu, Ru, Co, Rh, Mo, W, and Ta. Each lower bar 110A and 110B act as an electrode, herein lower bar 110A is the first electrode and lower bar 110B is the second electrode. The space between each of the lower bars 110A and 110B is filled with a dielectric material 115. The dielectric material 115 can be selected from a group that includes $SiO_2$, SiCOH, TEOS, SiN, low k dielectrics, or ultra-low k dielectrics.

Figure 3:
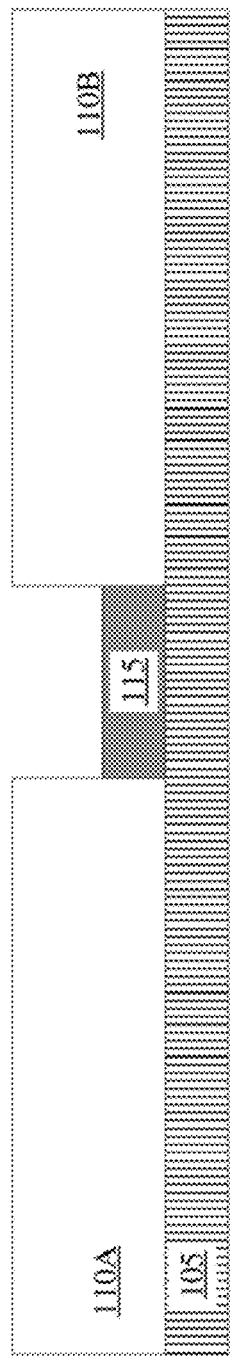
FIG. 3 illustrates the removal of dielectric material along cross section A of the crossbar device, in accordance with an embodiment of the present invention.

FIG. 3 illustrates the removal of the dielectric material 115 along cross section A of the crossbar device 100, in accordance with an embodiment of the present invention. The dielectric material 115 is etched to create a trench between the lower bars 110A and 110B. The trench allows for the formation of a third electrode between the lower bars 110A and 110B. The placement of the third electrode allows for the lower bar 110A (i.e. the first electrode) and the lower bar 110B (i.e. the second electrode) to be connected in parallel, since the first electrode and the second electrode both are connected to the third electrode.

Figure 4:
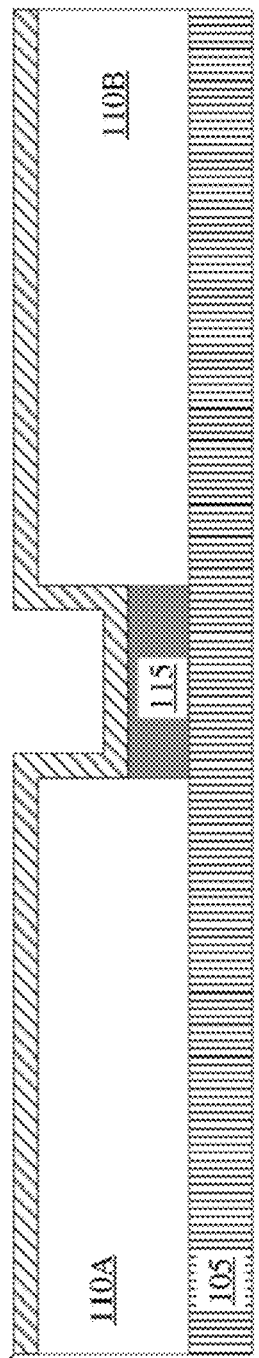
FIG. 4 illustrates the formation of the first layer along the exposed surface along cross section A of the crossbar device, in accordance with an embodiment of the present invention.

FIG. 4 illustrates the formation of the first layer 120 along the exposed surfaces along cross section A of the crossbar device, in accordance with an embodiment of the present invention. A first layer 120 is formed on the exposed surface of the lower bars 110A and 110B and the dielectric material 115. The first layer 120 can be formed of a material selected from a group that includes $HfO_x$, $HfO_2$, $ZrO_2$, $TiO_2$, $Al_2O_3$, NiO, $MnO_2$, and $TaO_2$. The first layer 120 can be formed by, for example, physical vapor deposition (PVD), atomic layer deposition (ALD) and chemical vapor deposition (CVD), or other deposition techniques.

FIG. 5 illustrates the formation of the third electrode (second layer 125) along cross section A of the crossbar device, in accordance with an embodiment of the present invention.

A second layer 125 is formed on the exposed surfaces of the first layer 120. The second layer 125 can be formed by, for example, physical vapor deposition (PVD), atomic layer deposition (ALD) and chemical vapor deposition (CVD), or other deposition techniques. The second layer 125 can be formed of a material selected from a group that includes TiN, Al, Ti, Cu, Ag, W, Pt, Au, Ni, TaN, conductive oxides such as indium tin oxide, Al- or Ga-doped ZnO, p-type doped Si, n-type doped Si, or combination thereof.

FIG. 6 illustrates the planarization along cross section A of the crossbar device 100, in accordance with an embodiment of the present invention. The second layer 125 and the first layer 120 are planarized to expose the top surface of the lower bars 110A and 110B. The trench is filled with the first layer 120 and the second layer 125. The exposed surfaces of the first layer 120 and the second layer 125 are planar with the exposed surface of the lower bars 110A and 110B.

FIG. 7 illustrates the formation of an etch stop 130 and a dielectric layer 135 on the exposed surface along cross section A of the crossbar device 100, in accordance with an embodiment of the present invention. An optional etch stop 130 can be formed on the exposed surfaces of the first layer 120, the second layer 125, and lower bars 110A and 110B. The etch stop 130 can be formed of a material selected from a group that includes NBLOK, SiN, $Al_2O_3$. A dielectric layer 135 can be formed on top of the etch stop 130 or directly on top of the exposed surfaces of the first layer 120, the second layer 125, and lower bars 110A and 110B. The dielectric layer 135 can be selected from a group that includes $SiO_2$, SiCOH, TEOS, SiN, low k dielectrics, or ultra-low k dielectrics.

Figure 8:
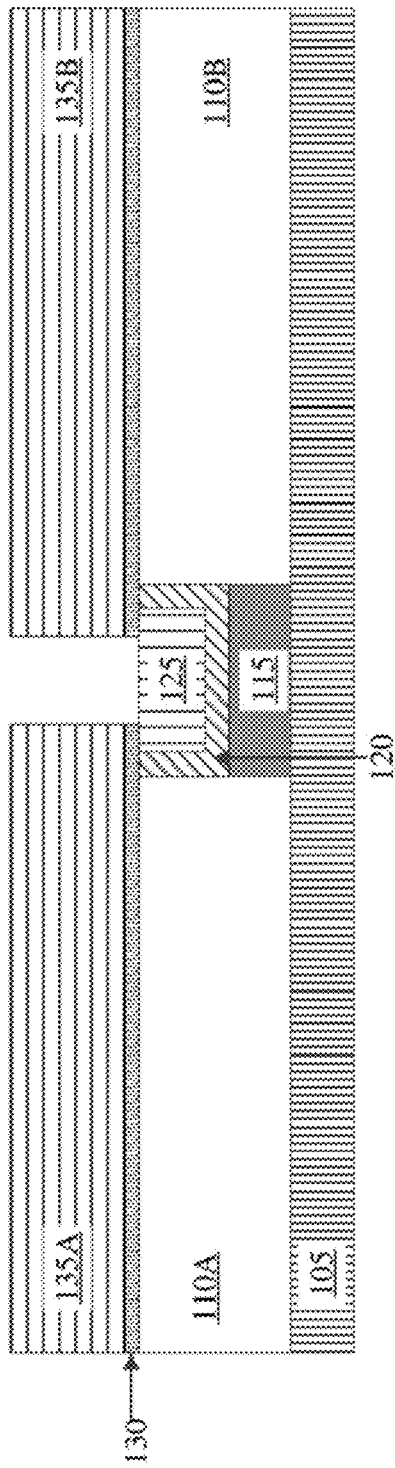
FIG. 8 illustrates the patterning and etching to form a via in the dielectric layer down to the second electrode along cross section A of the crossbar device, in accordance with an embodiment of the present invention.

FIG. 8 illustrates the patterning and etching to form a via in the dielectric layer 135 down to the third electrode (i.e. second layer 125) along cross section A of the crossbar device 100, in accordance with an embodiment of the present invention. The dielectric layer 135 is patterned and etched to form a via in the dielectric layer 135 down to the second layer 125 that forms the third electrode. The via is formed between two sections of the dielectric layer 135A and 135B. The etch stop 130 acts as a barrier to the etching process of the dielectric layer 135. The etch stop 130 prevents the etching process from damaging the second layer 125. A second etching process is utilized to remove the etch stop 130 located in the via.

Figure 9:
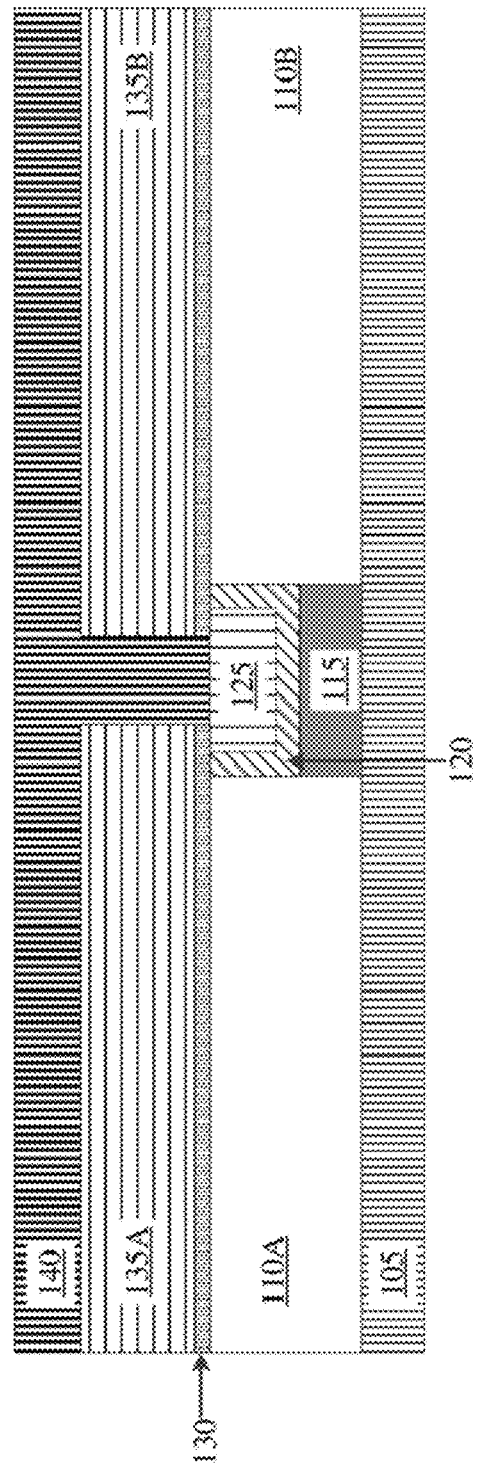
FIG. 9 illustrates the formation of the upper metal layer in the crossbar device along cross section A, in accordance with an embodiment of the present invention.

FIG. 9 illustrates the formation of the upper metal layer 140 in the crossbar device 100 along cross section A, in accordance with an embodiment of the present invention.

The upper metal layer 140 can be formed by, for example, physical vapor deposition (PVD), atomic layer deposition (ALD) and chemical vapor deposition (CVD), or other deposition techniques. The upper metal layer 140 is formed on the exposed surfaces of the dielectric layer 135A and 135B, and fills the via extending down to the top surface of the second layer 125. The upper metal layer 140 can be formed of a material selected from a group that includes Cu, Ru, Co, Rh, Mo, W, and Ta.

The two lower electrodes (lower bars 110A and 110B) share a common upper electrode (second layer 125). The parallel connection between the lower electrodes is achieved by having the upper electrode located between the lower electrodes, thus allowing both the lower electrodes to electrically connect to the same upper electrode. The resistance variability in the RRAM crossbar array is reduced by operating the electrodes in parallel. The variance of the RRAM Program Pair (RPP), i.e. two lower electrodes sharing a signal upper electrode, is ⅛ the resistance variance of a single RRAM device.

FIG. 10 illustrates the formation of the first and second electrodes along cross section A of the crossbar device 100, in accordance with an embodiment of the present invention.

A first metal layer is formed on top of a substrate 205. The substrate 205 can be any type of material, for example, it can be, a substrate, silicon wafer, a sapphire wafer, a metal layer, a conductor layer, an insulator, or any other type of material used in creating multi-layered devices. The lower metal layer can be formed by, for example, physical vapor deposition (PVD), atomic layer deposition (ALD) and chemical vapor deposition (CVD), or other deposition techniques. The lower metal layer is etched, for example, including the deposition of hard mask materials, lithography, pattern transfer and ultimately reactive ion etching (RIE), to form each of the plurality lower bars 101. FIG. 10 illustrates a first lower bar 210A and a second lower bar 210B. The lower bar 210A or 210B can be formed of a material selected from a group that includes Cu, Ru, Co, Rh, Mo, W, and Ta. Each lower bar 210A and 210B act as an electrode, herein lower bar 210A is the first electrode and lower bar 210B is the second electrode. The space between each of the lower bars 210A and 210B is filled with a dielectric material 215. The dielectric material 215 can be selected from a group that includes $SiO_2$, SiCOH, TEOS, SiN, low k dielectrics, or ultra-low k dielectrics.

FIG. 11 illustrates the removal of dielectric material 215 and the formation of a separating layer 222 along cross section A of the crossbar device, in accordance with an embodiment of the present invention. The dielectric material 215 is etched to create a trench between the lower bars 210A and 210B. The trench allows for the formation of a third electrode between the lower bars 210A and 210B. The placement of the third electrode allows for the lower bar 210A (i.e. the first electrode) and the lower bar 210B (i.e. the second electrode) to be connected in parallel. A separating layer 222 is formed on the exposed surfaces of the lower bars 210A, 210B, and on the exposed surface of the dielectric material 215. The separating layer can be selected from a group that includes Cu, Ru, Co, Rh, Mo, W, Ta, Al, Ti, Cu, Ag, W, Pt, Au, Ni, TaN, conductive oxides such as indium tin oxide, Al- or Ga-doped ZnO, n-type doped Si, p-type doped Si, or other suitable materials. The material of the separating layer 222 is different than the material of the lower bars 210A and 210B. The reason for the separating layer 222 is to provide a different bonding surface for the first layer 220. Depending on the material selected for the lower bars 210A and 210B can cause issues (e.g. electrical connection issues, bonding issues, etc.) with the connection with the first layer 220. The separating layer 222 acts as an intermediate layer to prevent connection issues between the lower bars 210A and 210B and the first layer 220.

FIG. 12 illustrates the removal of a portion of the separating layer 222 and the formation of a first layer 220 along the exposed surfaces along cross section A of the crossbar device 100, in accordance with an embodiment of the present invention. The separating layer 222 is etched to allow a section of the separating layer 222 to remain on the side wall within the trench of each lower bar 210A and 210B. The etching can be accomplished by reactive ion etch (RIE) or other suitable etching means. A first layer 220 is formed on the exposed surface of the lower bars 210A and 210B, the dielectric material 215, and the separating layer 222. The first layer 220 can be formed of a material selected from a group that includes $HfO_x$, $HfO_2$, $ZrO_2$, $TiO_2$, $Al_2O_3$, NiO, $MnO_2$, and $TaO_2$. The first layer 220 can be formed by, for example, physical vapor deposition (PVD), atomic layer deposition (ALD) and chemical vapor deposition (CVD), or other deposition techniques.

Figure 13:
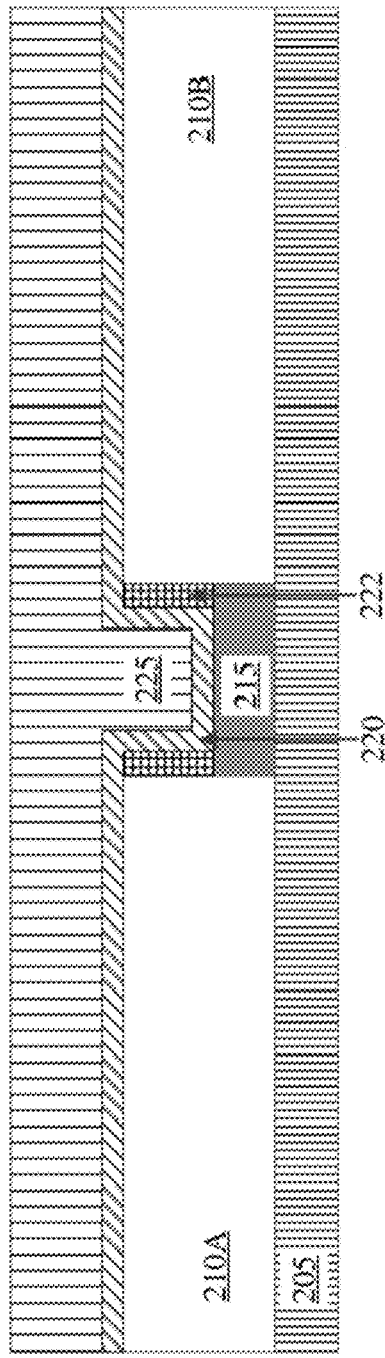
FIG. 13 illustrates the formation of the third electrode along cross section A of the crossbar device, in accordance with an embodiment of the present invention.

FIG. 13 illustrates the formation of the third electrode (second layer 225) along cross section A of the crossbar device, in accordance with an embodiment of the present invention.

A second layer 225 is formed on the exposed surfaces of the first layer 220. The second layer 225 can be formed by, for example, physical vapor deposition (PVD), atomic layer deposition (ALD) and chemical vapor deposition (CVD), or other deposition techniques. The second layer 225 can be formed of a material selected from a group that includes TiN, Al, Ti, Cu, Ag, W, Pt, Au, Ni, TaN, conductive oxides such as indium tin oxide, Al- or Ga-doped ZnO, p-type doped Si, n-type doped Si, or combination thereof.

Figure 14:
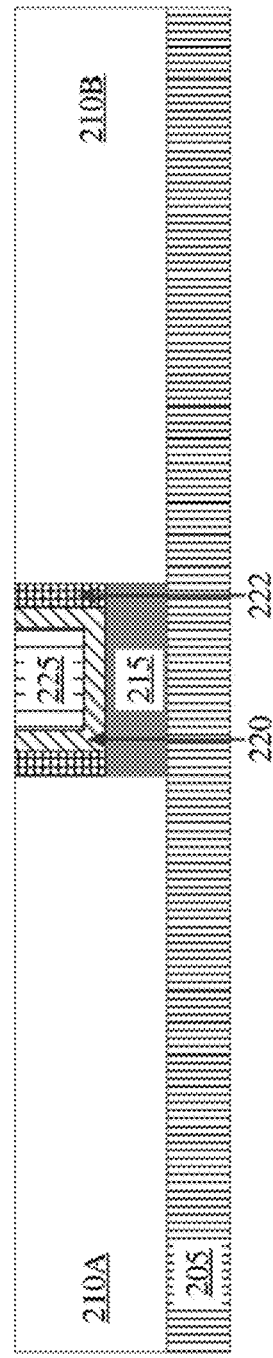
FIG. 14 illustrates the planarization along cross section A of the crossbar device, in accordance with an embodiment of the present invention.

FIG. 14 illustrates the planarization along cross section A of the crossbar device, in accordance with an embodiment of the present invention. The second layer 225 and the first layer 220 are planarized to expose the top surface of the lower bars 210A and 2110B and the top surface of the separating layer 222. The trench between the lower bars 210A and 210B is filled with the first layer 220, the second layer 225 and the separating layer 222. The exposed surfaces of first layer 220, the second layer 225, and the separating layer 222 are planar with the exposed surface of the lower bars 210A and 210B.

Figure 15:
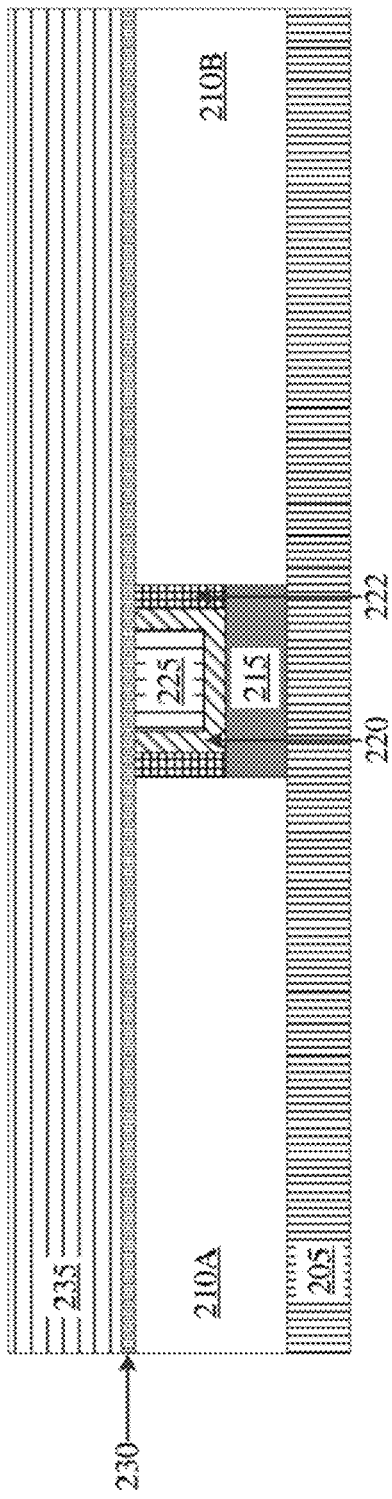
FIG. 15 illustrates the formation of an etch stop and a dielectric layer on the exposed surface along cross section A of the crossbar device, in accordance with an embodiment of the present invention.

FIG. 15 illustrates the formation of an etch stop 230 and a dielectric layer 235 on the exposed surfaces along cross section A of the crossbar device, in accordance with an embodiment of the present invention. An optional etch stop 230 can be formed on the exposed surfaces of the first layer 220, the second layer 225, separating layer 222, and lower bars 210A and 210B. The etch stop 230 can be formed of a material selected from a group that includes NBLOK, SiN, $Al_2O_3$. A dielectric layer 235 can be formed on top of the etch stop 230 or directly on top of the exposed surfaces layer 220, the second layer 225, the separating layer 222, and lower bars 210A and 210B. The dielectric layer 235 can be selected from a group that includes $SiO_2$, SiCOH, TEOS, SiN, low k dielectrics, or ultra-low k dielectrics.

Figure 16:
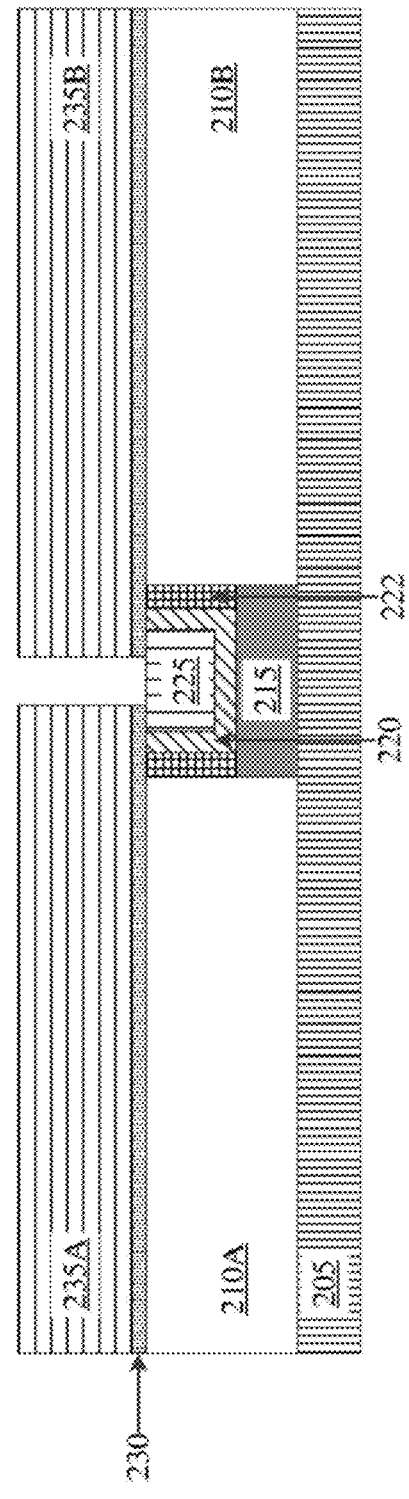
FIG. 16 illustrates the patterning and etching to form a via in the dielectric layer down to the second electrode along cross section A of the crossbar device, in accordance with an embodiment of the present invention.

FIG. 16 illustrates the patterning and etching to form a via in the dielectric layer down to the third electrode (i.e. second layer 225) along cross section A of the crossbar device, in accordance with an embodiment of the present invention. The dielectric layer 235 is patterned and etch to form a via in the dielectric layer 235 down to the second layer 225 that forms the third electrode. The via is formed between two sections of the dielectric layer 235A and 235B. The etch stop 230 acts as a barrier to the etching process of the dielectric layer 235. The etch stop 230 prevents the etching process from damaging the surface of the second layer 225. A second etching process is utilized to remove the etch stop 230 located in the via to expose the top surface of the second layer 225.

Figure 17:
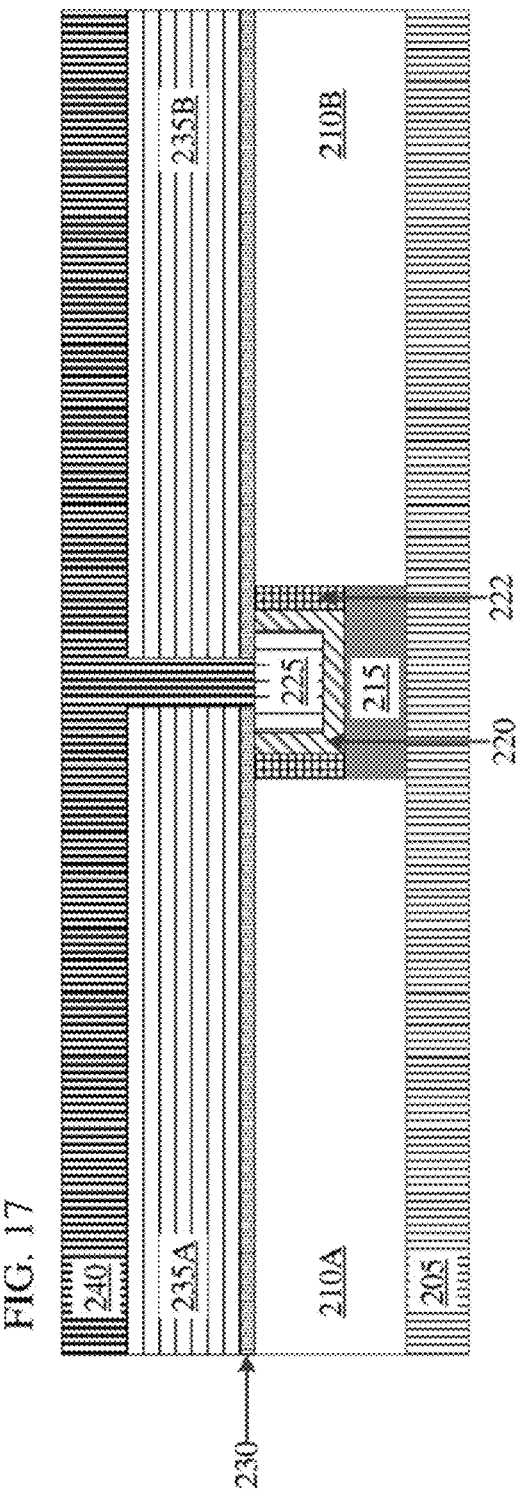
FIG. 17 illustrates the formation of the upper metal layer in the crossbar device along cross section A, in accordance with an embodiment of the present invention.

FIG. 17 illustrates the formation of the upper metal layer in the crossbar device along cross section A, in accordance with an embodiment of the present invention.

The upper metal layer 240 can be formed by, for example, physical vapor deposition (PVD), atomic layer deposition (ALD) and chemical vapor deposition (CVD), or other deposition techniques. The upper metal layer 240 is formed on the exposed surfaces of the dielectric layer 235A and 235B, and fills the via extending down to the top surface of the second layer 225. The upper metal layer 240 can be formed of a material selected from a group that includes Cu, Ru, Co, Rh, Mo, W, and Ta.

The two lower electrodes (lower bars 210A and 210B) share a common upper electrode (second layer 225). The parallel connection between the lower electrodes is achieved by having the upper electrode located between the lower electrodes, thus allowing both the lower electrodes to electrically connect to the same upper electrode. The resistance variability in the RRAM crossbar array is reduced by operating the electrodes in parallel. The variance of the RRAM Program Pair (RPP), i.e. two lower electrodes sharing a signal upper electrode, is ⅛ the resistance variance of a single RRAM device.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. An apparatus comprising:
a dielectric layer located between a first electrode and a second electrode;
a third electrode located on the dielectric layer between the first electrode and the second electrode, wherein the first electrode is adjacent to a first side of the dielectric layer, and the second electrode is adjacent to a second side of the dielectric layer, wherein the third electrode is adjacent to a third side of the dielectric layer; and
a first layer is in direct contact with multiple surfaces of the third electrode, wherein the first layer is in direct contact with the first electrode and the second electrode, and wherein the third electrode is comprised of a second layer, wherein the top surface of the first layer and second layer is planar with a top surface of the first electrode and a top surface of the second electrode.

2. The apparatus of claim 1, wherein the second layer is in direct contact with the first layer and in direct contact with an upper metal component.

3. The apparatus of claim 1, wherein the material of the first layer is selected from the group consisting of includes $HfO_x$, $HfO_2$, $ZrO_2$, AnO, $TiO_2$, $Al_2O_3$, NiO, $MnO_2$, or $TaO_2$.

4. The apparatus of claim 1, wherein the material of the second layer is selected from the group consisting of TIN, Al, Ti, Cu, Ag, W, Pt, Au, Ni, TaN, conductive oxides such as indium tin oxide, Al- or Ga-doped ZnO, p-type doped Si, n-type doped Si, or any combination thereof.

5. The apparatus of claim 1, wherein the first layer is located directly on top of the dielectric layer and the second layer is located directly on top of the first layer.

6. The apparatus of claim 1, wherein the material of the dielectric layer is selected from the group consisting of $SiO_2$, SiCOH, TEOS, SiN, low k dielectrics, or ultra-low k dielectrics.

7. An apparatus comprising:
a dielectric layer located between a first electrode and a second electrode;
a third electrode located on the dielectric layer between the first electrode and the second electrode, wherein the first electrode is adjacent to a first side of the dielectric layer, and the second electrode is adjacent to a second side of the dielectric layer, wherein the third electrode is adjacent to a third side of the dielectric layer, wherein the third electrode is comprised of a second layer;
a first layer is in direct contact with multiple surfaces of the third electrode; and
a separating layer, wherein the separating layer is in direct contact with the first electrode and the second electrode.

8. The apparatus of claim 7, wherein the first layer is in direct contact with the separating layer, and wherein the second layer is in direct contact with an upper metal component.

9. The apparatus of claim 8, wherein the first layer is located directly on top of the dielectric layer and the second layer is located directly on top of the first layer.

10. The apparatus of claim 9, wherein the separating layer and the first layer are in direct contact with the dielectric layer.

11. The apparatus of claim 7, comprising:
wherein a first material for the first electrode is selected from the group consisting of includes Cu, Ru, Co, Rh, Mo, W, or Ta;
wherein a second material for the second electrode is selected from the group consisting of includes Cu, Ru, Co, Rh, Mo, W, or Ta;
wherein a third material for the separating layer is selected from the group consisting of includes Cu, Ru, Co, Rh, Mo, W, or Ta;
wherein the third material and the first material are different; and
wherein the third material and the second material are different.

12. An apparatus comprising:
a plurality of lower electrodes spaced apart from each other;
a plurality of dielectric layers, wherein one of the plurality of dielectric layers is located between two adjacent lower electrodes of the plurality of lower electrodes;
a plurality of connecting electrodes, wherein each of the plurality of connecting electrodes is located on the dielectric layer located between two adjacent lower electrodes of the plurality of lower electrodes, wherein the one of the two adjacent lower electrodes is adjacent to a first side of the dielectric layer, and the second of the two adjacent lower electrodes is adjacent to a second side of the dielectric layer, wherein each of the plurality of connecting electrodes is adjacent to a third side of the dielectric layer.

13. The apparatus of claim 12, further comprising:
a first layer, wherein the first layer is in direct contact with the two adjacent lower electrodes; and
wherein each of the plurality of connecting electrodes is comprised of a second layer.

14. The apparatus of claim 13, wherein the second layer is in direct contact with the first layer and in direct contact with an upper metal component.

15. The apparatus of claim 13, wherein the material of the first layer is selected from the group consisting of includes $HfO_x$, $HfO_2$, $ZrO_2$, AnO, $TiO_2$, $Al_2O_3$, NiO, $MnO_2$, or $TaO_2$.

16. The apparatus of claim 13, wherein the material of the second layer is selected from the group consisting of includes TIN, Al, Ti, Cu, Ag, W, Pt, Au, Ni, TaN, conductive oxides such as indium tin oxide, Al- or Ga-doped ZnO, p-type doped Si, n-type doped Si, or any combination thereof.

17. The apparatus of claim 13, wherein the top surface of the first layer and second layer is planar with a top surface of the plurality of the lower electrodes.

* * * * *